(12) United States Patent
Lee et al.

(10) Patent No.: US 10,141,232 B2
(45) Date of Patent: Nov. 27, 2018

(54) VERTICAL CMOS DEVICES WITH COMMON GATE STACKS

(71) Applicant: International Business Machines Corporation, Armonk, NY (US)

(72) Inventors: ChoongHyun Lee, Rensselaer, NY (US); Injo Ok, Loudonville, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 15/198,128

(22) Filed: Jun. 30, 2016

(65) Prior Publication Data

US 2018/0005904 A1 Jan. 4, 2018

(51) Int. Cl.
| | |
|---|---|
| *H01L 21/8238* | (2006.01) |
| *H01L 27/092* | (2006.01) |
| *H01L 29/04* | (2006.01) |
| *H01L 29/06* | (2006.01) |
| *H01L 29/16* | (2006.01) |
| *H01L 29/205* | (2006.01) |

(52) U.S. Cl.
CPC ........ *H01L 21/823885* (2013.01); *H01L 21/823807* (2013.01); *H01L 21/823871* (2013.01); *H01L 21/823878* (2013.01); *H01L 27/092* (2013.01); *H01L 29/045* (2013.01); *H01L 29/0676* (2013.01); *H01L 29/16* (2013.01); *H01L 29/205* (2013.01)

(58) Field of Classification Search
CPC ..... H01L 21/823885; H01L 21/823807; H01L 21/823871; H01L 21/823878; H01L 27/092; H01L 29/045; H01L 29/0676; H01L 29/16; H01L 29/205

USPC .......................................................... 257/192
See application file for complete search history.

(56) References Cited

U.S. PATENT DOCUMENTS

| | | | |
|---|---|---|---|
| 7,230,286 B2 | 6/2007 | Cohen et al. | |
| 7,536,069 B2 * | 5/2009 | McNab ................. | B82Y 20/00 385/132 |
| 8,606,060 B2 * | 12/2013 | Hamann ............... | B82Y 20/00 385/125 |
| 8,772,771 B2 | 7/2014 | Tanaka | |

(Continued)

OTHER PUBLICATIONS

M. Clavel et al., "Strain-Engineered Biaxial Tensile Epitaxial Germanium for High-Performance Ge/InGaAs Tunnel Field-Effect Transistors," Journal of the Electron Devices Society, May 2015, pp. 184-193, vol. 3, No. 3.

(Continued)

*Primary Examiner* — Hrayr A Sayadian
(74) *Attorney, Agent, or Firm* — Vazken Alexanian; Ryan, Mason & Lewis, LLP

(57) ABSTRACT

A semiconductor structure includes a first nanowire of a first material formed on a substrate, at least a second nanowire of a second material different than the first material formed on the substrate and a common gate stack surrounding the first nanowire and the second nanowire. The first nanowire and the second nanowire are vertical with respect to a horizontal plane of the substrate. The first material may be indium gallium arsenide (InGaAs) and the first nanowire may form part of an NFET channel of a CMOS device, while the second material may be germanium (Ge) and the second nanowire may form part of a PFET channel of the CMOS device.

19 Claims, 16 Drawing Sheets

(56) References Cited

U.S. PATENT DOCUMENTS

| | | |
|---|---|---|
| 8,932,940 B2 | 1/2015 | Wang et al. |
| 8,969,145 B2 | 3/2015 | Chang et al. |
| 9,209,247 B2 | 12/2015 | Colinge et al. |
| 9,209,271 B1 | 12/2015 | Lee et al. |
| 2016/0190336 A1* | 6/2016 | Xiao ............... B82Y 30/00 257/29 |
| 2018/0005904 A1* | 1/2018 | Lee ............ H01L 21/823885 |

OTHER PUBLICATIONS

K. Tomioka et al., "III-V Nanowires on Si Substrate: Selective-Area Growth and Device Applications," IEEE Journal of Selected Topics in Quantum Electronics, Jul./Aug. 2011, pp. 1112-1129, vol. 17, No. 4.

K. Tomioka et al., "A III-V Nanowire Channel on Silicon for High-Performance Vertical Transistors," Nature, Aug. 2012, pp. 189-193, vol. 488.

K. Tomioka et al., "III-V Nanowire Channel on Si: From High Performance Vertical FET to Steep-Slope Devices," Proceedings of International Symposium on VLSI Technology, Systems, and Applications, Jun. 2015, 2 pages.

W.D. Laidig et al., "Effects of Strain and Layer Thickness on the Growth of InxGa1-xAs—GaAs Strained-Layer Superlattices," Journal of Vacuum Science & Technololgy, Apr. 1984, pp. 181-185, vol. 2, No. 2.

T.G. Andersson et al., "Variation of the Critical Layer Thickness with in Content in Strained IInxGa1-xAs—GaAs Quantum Wells Grown by Molecular Beam Epitaxy," Applied Physics Letters, Sep. 1987, p. 752, vol. 51, No. 10.

* cited by examiner

100

150

200

250

300

350

400

450

500

550

600

650

700

750

800

850

900

950

1000

1050

1100

1150

1200

1250

1300

1350

1400

1450

1500

VERTICAL CMOS DEVICES WITH COMMON GATE STACKS

BACKGROUND

The present application relates to semiconductors, and more specifically, to techniques for forming semiconductor structures. Complementary metal-oxide-semiconductor (CMOS) technology may be used to form integrated circuits, useful in various applications including but not limited to microprocessors, microcontrollers, logic circuits, static random access memory (RAM), etc. Silicon is a common material used in CMOS technology. Silicon semiconductor fabrication, however, is approaching its fundamental scaling limits.

SUMMARY

Embodiments of the invention provide techniques for forming vertical CMOS devices with common gate stacks.

In one embodiment, a semiconductor structure comprises a first nanowire of a first material formed on a substrate, at least a second nanowire of a second material different than the first material formed on the substrate and a common gate stack surrounding the first nanowire and the second nanowire. The first nanowire and the second nanowire are vertical with respect to a horizontal plane of the substrate. The first material may be indium gallium arsenide (InGaAs) and the first nanowire may form part of a negative field-effect transistor (NFET) channel of a CMOS device, while the second material may be germanium (Ge) and the second nanowire may form part of a positive field-effect transistor (PFET) channel of the CMOS device.

DETAILED DESCRIPTION

Figure 1A:
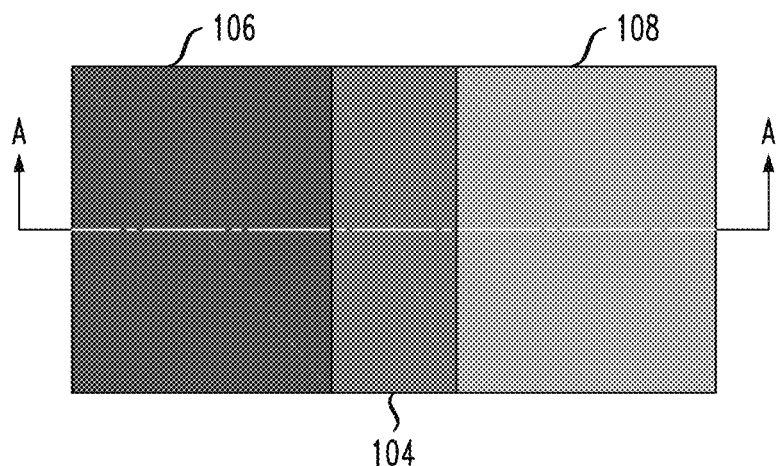
FIG. 1A depicts a top view of a substrate with doped regions formed therein, according to an embodiment of the invention.

Illustrative embodiments of the invention may be described herein in the context of illustrative methods for forming vertical CMOS transistors or devices with common gate stacks, along with illustrative apparatus, systems and devices with vertical CMOS devices having common gate stacks. However, it is to be understood that embodiments of the invention are not limited to the illustrative methods, apparatus, systems and devices but instead are more broadly applicable to other suitable methods, apparatus, systems and devices.

As silicon CMOS technology reaches its fundamental scaling limits, alternative materials are being considered for extending high performance logic devices. For example, materials such as high mobility group III-V materials and group II-IV materials are strong contenders for extending high performance logic devices. Indium gallium arsenide (InGaAs) is an example of such a group III-V material, and silicon germanium (SiGe) and germanium (Ge) are examples of such group II-IV materials.

Vertical transport field effect transistors (FETs) have potential advantages over conventional fin FETs (FinFETs) in terms of density, performance, power consumption and integration. Forming vertical CMOS transistors with group III-V channels for n-channel FETs (NFETs) and group II-IV channels for p-channel FETS (PFETs) is difficult, however, due to issues in integrating free-standing group III-V and group II-IV material nanostructures on a silicon substrate. Illustrative embodiments overcome such difficulties through the use of position-controlled growth of vertical group III-V and group II-IV nanowires on silicon without requiring any buffering.

In some embodiments, FETs are formed having group III-V and II-IV channel regions that are generally vertical with respect to the horizontal plane of a silicon wafer. Gates may be wrapped around nanowire channels to provide a best possible electrostatic gate control, also referred to as surrounding-gate transistors. The use of group III-V and II-IV channels on silicon provides good electrostatic gate control in such surrounding-gate transistors.

Embodiments provide a number of advantages, including by way of example providing an integration scheme of vertical CMOS with group III-V and group II-IV channels. Such vertical CMOS devices may utilize, for example, InGaAs as the NFET channel while using SiGe or Ge as the PFET channel. While various embodiments are described below using InGaAs and Ge, embodiments are not limited solely to use with these materials. In some embodiments, InGaAs and Ge channel growth is provided on gallium arsenide (GaAs) dummy channels. A common gate stack for the InGaAs and Ge channels is provided. Embodiments also permit the use of low temperature top metal source/drain formation on the InGaAs and Ge channels. Quantum well structures on both vertical NFETs and PFETs are also provided.

Vertical transport FETs themselves have various advantages. For example, vertical FETs allow scaling to sub-30 nanometer (nm) contacted poly pitch (CPP), thus providing greater density relative to FinFETs. Advantageously, vertical FETs do not require diffusion breaks between devices, and nested devices have very effective diffusion length (leff) density and low capacitance.

Some vertical FETs also provide for higher performance and/or lower power. Faster devices are provided due to higher leff, also supporting higher max voltage (Vmax). Gate length (lgate) is also not limited by CPP and thus the device has better Ion versus Ioff current ratio. As an example, lgate may be approximately 15 nm, but may be longer or shorter if desired. The capacitance of vertical FETs is comparable to isolated FETs. Vertical FET (VFET) capacitance is lower for multi-finger devices than lateral FETs. Vertical FETs also eliminate FinFET width quantization, thus saving power by not over-sizing device width. The use of vertical FETs also permits large bottom source/drain regions to reduce lateral resistance. Lower contact resistance is also provided by eliminating top source/drain contact resistance. FETs in series fins can also avoid contact resistance on both the source and drain.

Vertical FETs can also provide benefits relating to manufacturability and scaling. For example, it is easier to integrate multi-material stacked structures using vertical FETs. Contact resistance to bottom source/drain design flexibility is also advantageous. Vertical FETs also provide much lower aspect ratios for etch and fill processes. Better connectivity also allows relaxed trench silicide, contact and metal features.

Figure 1B:
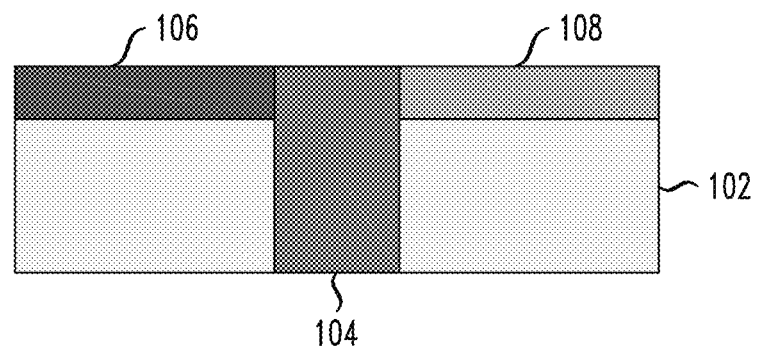
FIG. 1B depicts a side cross-sectional view of the FIG. 1A structure, according to an embodiment of the invention.

FIGS. 1-15 below show a process for forming vertical CMOS devices with NFET and PFET channels having a common gate stack. FIG. 1A shows a top view 100 of a structure. FIG. 1B shows a side cross-sectional view 150 taken along the line A-A shown in the top view 100 of FIG. 1A. The structure includes a silicon substrate 102, with a shallow trench isolation (STI) region 104 separating doped regions 106 and 108. The silicon substrate 102 may have a crystalline orientation (111). The doped region 106 may be a highly-doped n+ region, while the doped region 108 may be a highly-doped p+ region. The doped regions 106 and 108 are used for bottom source/drains in the resulting structure.

The silicon substrate 102 may be approximately 5 nanometers (nm) to 100 nm thick in some embodiments, and may be formed of bulk silicon or a silicon on insulator (SOI) wafer. The doped regions 106 and 108 may be formed approximately 5 nm to 100 nm from the top surface of the silicon substrate 102 in some embodiments. The STI region 104 may be approximately 50 nm to 200 nm wide in some embodiments.

Figure 2A:
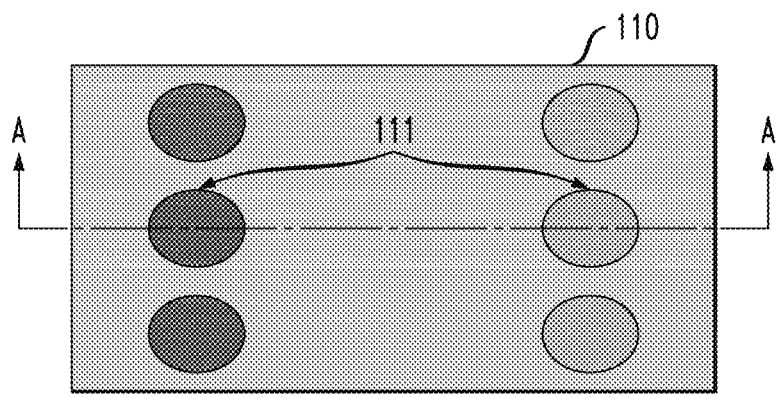
FIG. 2A depicts a top view of the FIG. 1A structure following formation and patterning of an insulator, according to an embodiment of the invention.
Figure 2B:
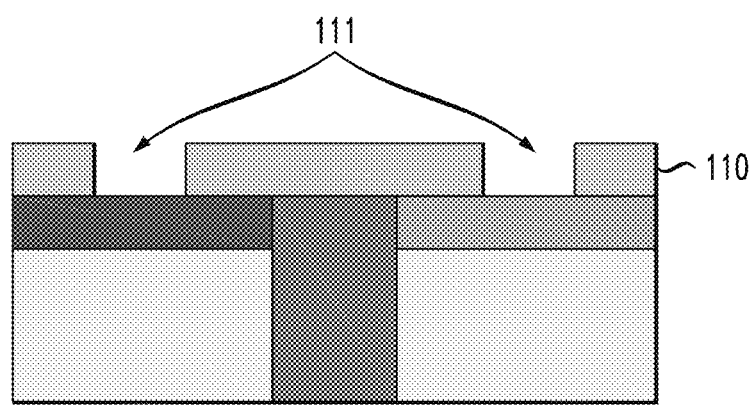
FIG. 2B depicts a side cross-sectional view of the FIG. 2A structure, according to an embodiment of the invention.

FIG. 2A shows a top view 200 of the FIG. 1A structure following formation and patterning of an insulator 110. FIG. 2B shows a side cross-sectional view 250 taken along the line A-A in top view 200 of FIG. 2A. The insulator 110 may be deposited using either atomic layer deposition or chemical vapor deposition. The insulator 110 may be formed of SiBCN, silicon nitride or any silicon nitride-based low-k material containing boron, carbon, or oxygen. The insulator 110 acts as a bottom spacer in the resulting structure. The insulator 110 may be patterned so as to form spaces 111. A photoresist layer may be used for such patterning. In some embodiments, the insulator 110 is approximately 4 nm to 12 nm thick. The spaces 111 may be approximately 5 nm to 20 nm wide in some embodiments. Although the top view 200 shows six spaces 111 formed in the insulator 110, embodiments are not so limited. Any desired number/arrangement of spaces 111 may be formed to permit the formation of CMOS transistors or devices at varying locations.

Figure 3A:
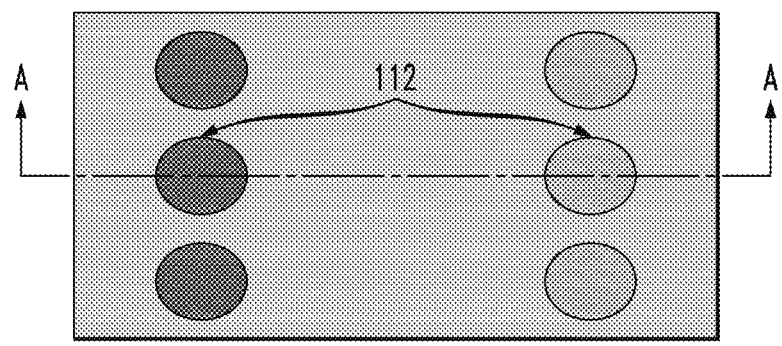
FIG. 3A depicts a top view of the FIG. 2A structure following formation of dummy channels, according to an embodiment of the invention.
Figure 3B:
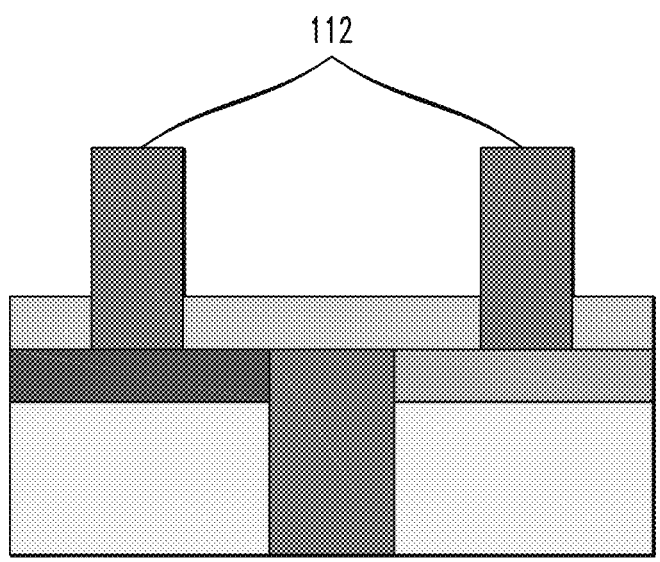
FIG. 3B depicts a side cross-sectional view of the FIG. 3A structure, according to an embodiment of the invention.

FIG. 3A shows a top view 300 of the FIG. 2A structure following formation of dummy channels 112. FIG. 3B shows a side cross-sectional view 350 taken along the line A-A in top view 300 of FIG. 3A. An epitaxial growth process may form the dummy channels 112. In some embodiments, the dummy channels 112 may be formed of GaAs, although other materials be used, such as InGaAs or $In_xGa_{1-x}As$ (where 0<x<0.75) as will be described in further detail below with respect to FIG. 7. The dummy channels 112 may have a height of approximately 20 nm to 60 nm in some embodiments.

Figure 4A:
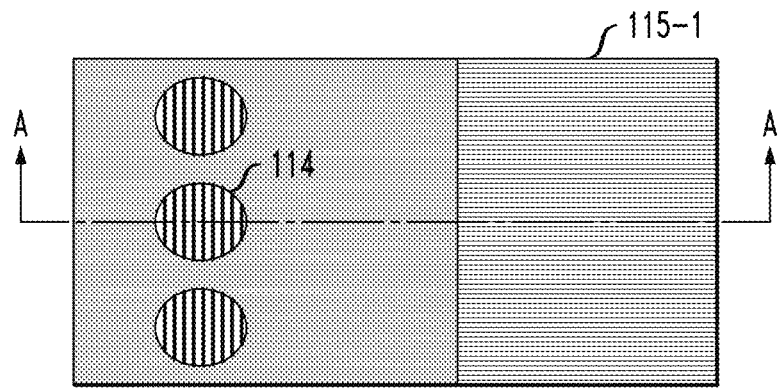
FIG. 4A depicts a top view of the FIG. 3A structure following formation of an epi layer on an NFET side, according to an embodiment of the invention.
Figure 4B:
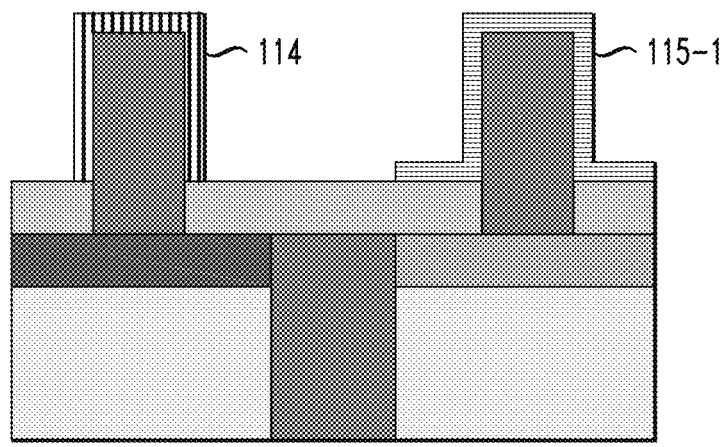
FIG. 4B depicts a side cross-sectional view of the FIG. 4A structure, according to an embodiment of the invention.

FIG. 4A shows a top view 400 of the FIG. 3A structure following formation of an epi layer 114 on the NFET side of the structure, e.g., over the dummy channel 112 formed over doped region 106. FIG. 4B shows a side cross-sectional view 450 taken along the line A-A in top view 400 of FIG. 4A. The epi layer 114 may be, for example, an InGaAs layer. $In_{0.4}Ga_{0.6}As$ can be grown on GaAs with minimum dislocation density. The thinner InGaAs layer is better in terms of defects control. The epi layer 114 may be approximately 2 nm to 6 nm thick in some embodiments. A blocking layer 115-1 is formed over the PFET side of the structure, e.g., over the dummy channel formed over doped region 108. The blocking layer 115-1 may initially be formed over the entire structure, and then patterned so as to cover the PFET side of the structure. The blocking layer 115-1 may be silicon nitride (SiN), silicon dioxide ($SiO_2$), silicon oxynitride (SiON) or another suitable material. The blocking layer 115-1 may be approximately 5 nm to 100 nm thick in some embodiments. The blocking layer 115-1 may be removed using a hydrofluoric (HF) acid bath or other suitable process.

Figure 5A:
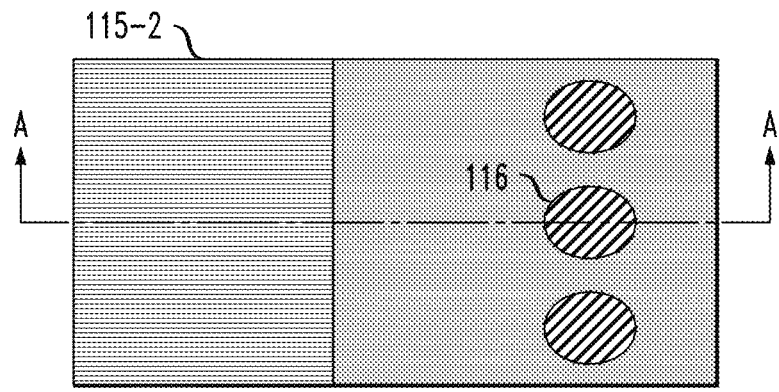
FIG. 5A depicts a top view of the FIG. 4A structure following formation of an epi layer on a PFET side, according to an embodiment of the invention.
Figure 5B:
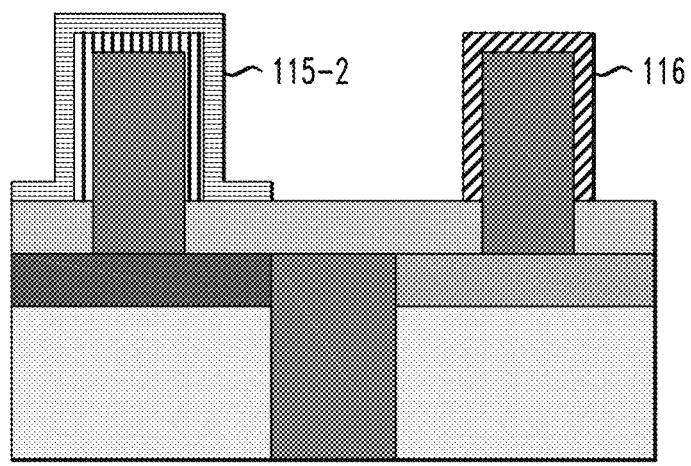
FIG. 5B depicts a side cross-sectional view of the FIG. 5A structure, according to an embodiment of the invention.

FIG. 5A shows a top view 500 of the FIG. 4A structure following formation of an epi layer 116 on the PFET side of the structure. FIG. 5B shows a side cross-sectional view 550 taken along the line A-A in top view 500 of FIG. 5A. The epi layer 116 may be, for example a Ge layer. Since Ge and GaAs share a lattice structure, Ge is easy to grow on the GaAs dummy gate 112. Similar to formation of the epi layer 114, formation of the epi layer 116 on the PFET side is facilitated by forming an epi blocking layer 115-2 over the NFET side of the structure. The epi layer 116 and epi blocking layer 115-2 may have dimensions comparable to those of epi layer 114 and epi blocking layer 115-1, respectively. The epi blocking layer 115-2 may be formed of materials similar to that of epi blocking layer 115-1.

Figure 6A:
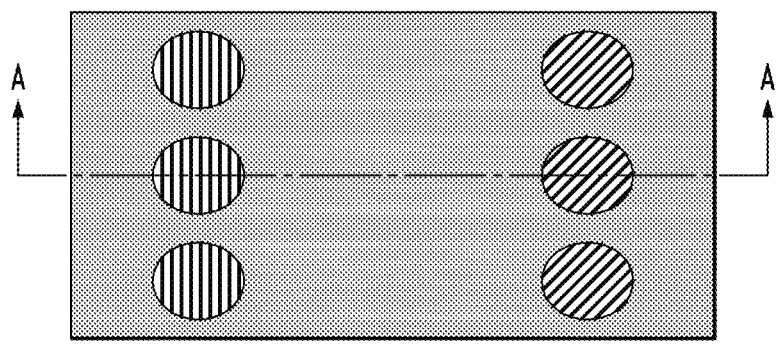
FIG. 6A depicts a top view of the FIG. 5A structure following formation of vertical channels, according to an embodiment of the invention.
Figure 6B:
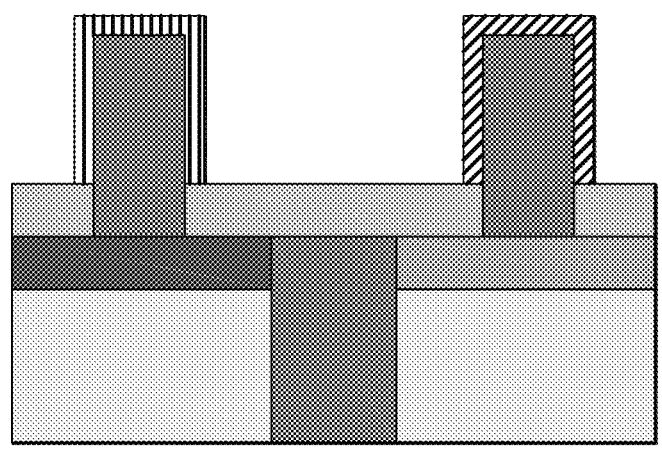
FIG. 6B depicts a side cross-sectional view of the FIG. 6A structure, according to an embodiment of the invention.

FIG. 6A shows a top view 600 of the FIG. 5A structure following formation of vertical channels by etching the epi blocking layer 115-2. FIG. 6B shows a side cross-sectional view 650 taken along the line A-A in top view 600 of FIG. 6A. This may be achieved, for example, using an $SiO_2$ etch or other suitable process to remove epi blocking layer 115-2.

Figure 7A:
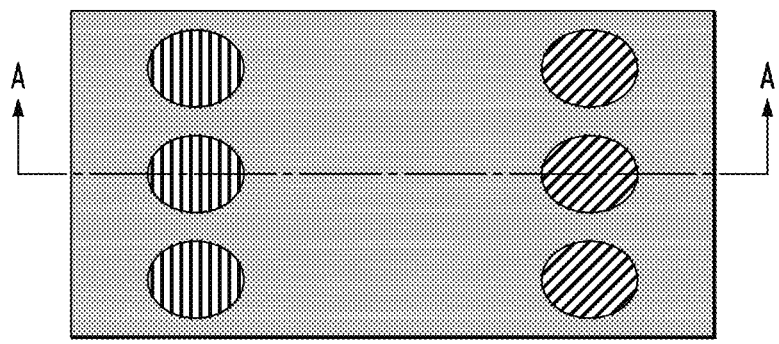
FIG. 7A depicts a top view of an alternate vertical channel structure, according to an embodiment of the invention.
Figure 7B:
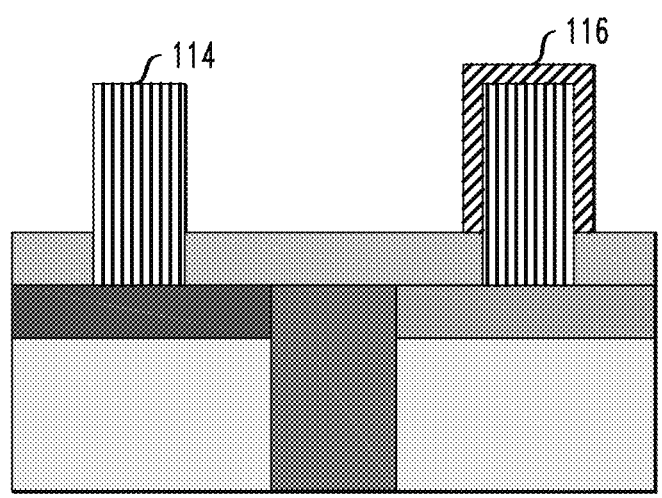
FIG. 7B depicts a side cross-sectional view of the FIG. 7A structure, according to an embodiment of the invention.

FIG. 7A shows a top view 700 of an alternate vertical channel structure. FIG. 7B shows a side cross-sectional view 750 taken along the line A-A in top view 700 of FIG. 7A. Compared to the structure shown in FIGS. 6A and 6B, the dummy channels 112 in FIGS. 7A and 7B are formed of InGaAs rather than GaAs. In the structure shown in FIGS. 7A and 7B, however, the dummy channel 112 on the NFET side of the structure is the actual channel rather than a dummy channel. The structure shown in FIGS. 7A and 7B may be formed as it is possible for $In_{0.3}Ga_{0.7}As$ to be directly grown on a Si (111) surface and Ge can be epitaxially grown on the $In_{0.3}Ga_{0.7}As$ dummy channel on the PFET side. Thus, the formation of the channel structure is simplified, as the processing described above with respect to FIGS. 4A and 4B is not needed. The alternate channel structure shown in FIGS. 7A and 7B is advantageous in reducing a number of fabrication steps. Due to lattice mismatches, however, it may be more difficult to grow Ge directly on the InGaAs dummy channel.

Figure 8A:
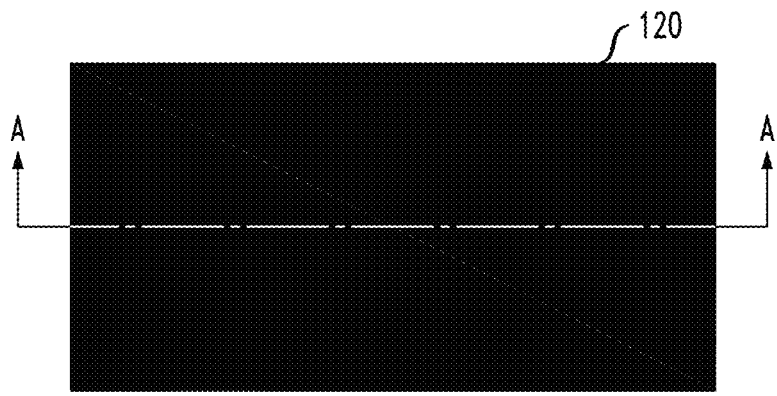
FIG. 8A depicts a top view of the FIG. 6A structure following formation of a common gate stack, according to an embodiment of the invention.
Figure 8B:
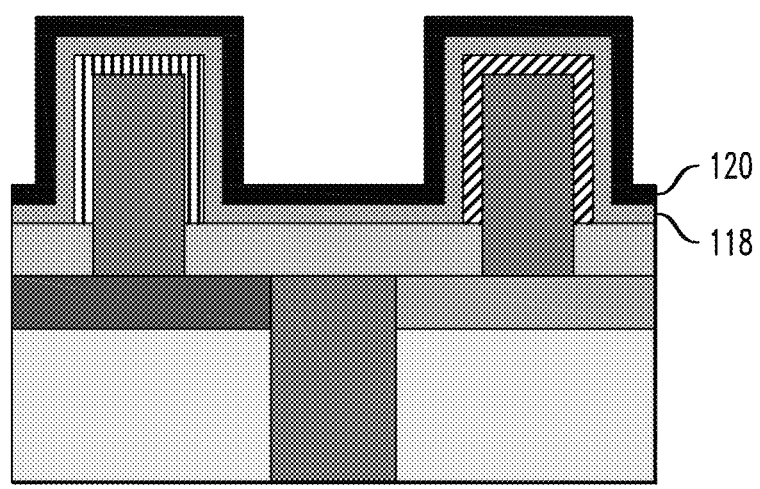
FIG. 8B depicts a side cross-sectional view of the FIG. 8A structure, according to an embodiment of the invention.

FIG. 8A shows a top view 800 of the FIG. 6A structure following formation of a common gate stack including layers 118 and 120. FIG. 8B shows a side cross-sectional view 850 taken along the line A-A in top view 800 of FIG. 8A. Layer 118 may be a bilayer of aluminum oxide ($Al_2O_3$) and hafnium oxide ($HfO_2$). $Al_2O_3$ acts as an interfacial layer for both InGaAs and Ge channels. There are several other options for high-k materials to be used in the layer 118, including but not limited to $Al_2O_3$/lanthanum oxide ($La_2O_3$), $Al_2O_3$/yttrium oxide ($Y_2O_3$), $Al_2O_3$/$HfO_2$/$La_2O_3$, etc. The layer 118 may be approximately 2 nm to 5 nm thick in some embodiments. Layer 120 may be, for example titanium nitride (TiN) although other suitable materials may be used including but not limited to TiN/titanium aluminum carbide (TiAlC)/TiN metal layers. Layer 120 may be approximately 4 nm to 10 nm thick in some embodiments. The layers 118 and 120 are referred to collectively herein as the gate stack or common gate stack. Layers 118 and 120 of the common gate stack may be formed using a variety of processes, including but not limited to various deposition processes.

Figure 9A:
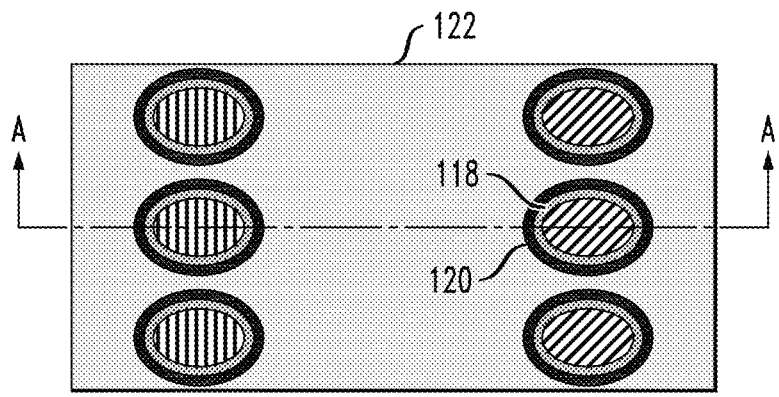
FIG. 9A depicts a top view of the FIG. 8A structure following recess of the common gate stack and deposition of a gate material, according to an embodiment of the invention.
Figure 9B:
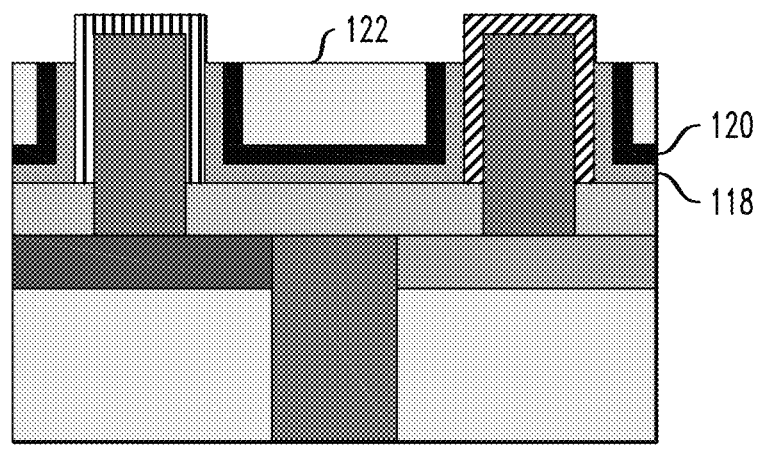
FIG. 9B depicts a side cross-sectional view of the FIG. 9A structure, according to an embodiment of the invention.

FIG. 9A shows a top view 900 of the FIG. 8 structure following recess of the common gate stack and deposition of gate material 122. FIG. 9B shows a side cross-sectional view 950 taken along the line A-A in top view 900 of FIG. 9A. As shown in view 950, the common gate stack layers 118 and 120 are etched back to expose portions of layers 114 and 116 on the dummy channels 112 in the NFET and PFET sides of the structure. Also shown is the formation of gate material 122. The gate material 122 may be a high-k metal gate such as tungsten (W) although other suitable materials may be used such as any W-based metal. The gate material 122 may be deposited, and then recessed using chemical mechanical planarization (CMP). The CMP process may stop on top of layer 118, and then gate material 122 may be recessed by a wet etch. Layer 118 is etched out using a different wet chemistry. Following this process, the layers 114 and 116 are exposed.

Figure 10A:
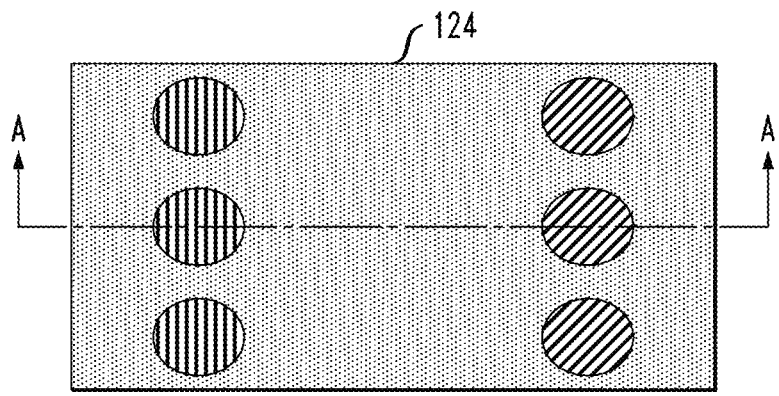
FIG. 10A depicts a top view of the FIG. 9A structure following deposition and planarization of an insulator, according to an embodiment of the invention.
Figure 10B:
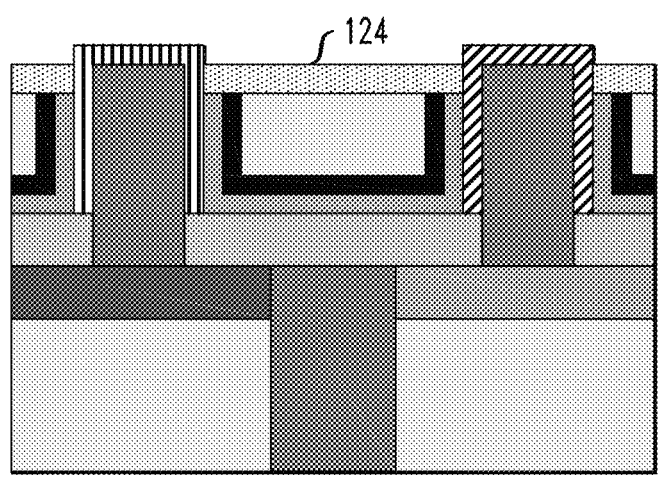
FIG. 10B depicts a side cross-sectional view of the FIG. 10A structure, according to an embodiment of the invention.

FIG. 10A shows a top view 1000 of the FIG. 9A structure following deposition and planarization of an insulator 124. FIG. 10B shows a side cross-sectional view 1050 taken along the line A-A in top view 1000 of FIG. 10A. The insulator 124 may be, for example, a SiBCN ceramic although other suitable materials may be used such as SiN-based materials containing boron, carbon or oxygen. The insulator 124 may have a thickness ranging from 4 nm to 12 nm in some embodiments. As shown, the insulator 124 is planarized such that its top surface is below a top surface of layers 114 and 116 on dummy channels 112.

Figure 11A:
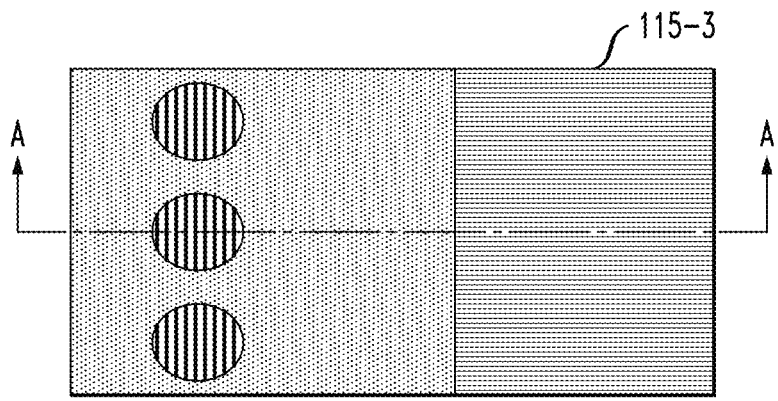
FIG. 11A depicts a top view of the FIG. 10A structure following doping of the NFET side, according to an embodiment of the invention.
Figure 11B:
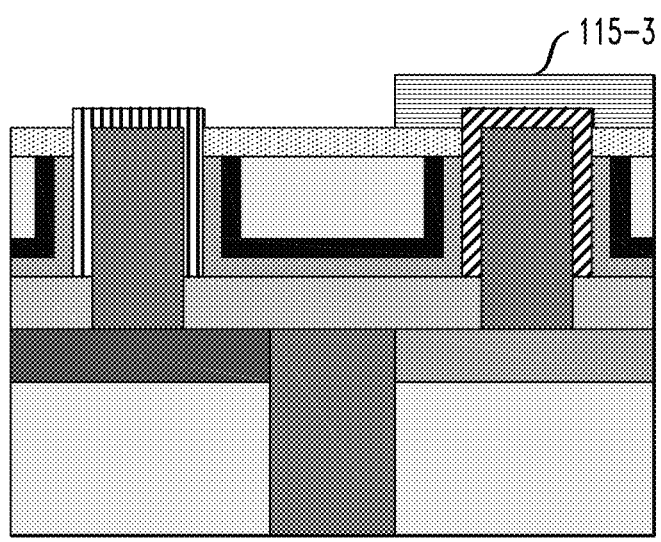
FIG. 11B depicts a side cross-sectional view of the FIG. 11A structure, according to an embodiment of the invention.

FIG. 11A shows a top view 1100 of the FIG. 10A structure following doping of the NFET side of the structure. FIG. 11B shows a side cross-sectional view 1150 taken along the line A-A in top view 1100 of FIG. 11A. As shown, an oxide layer 115-3 is formed over the layer 116 in the PFET side of the structure. The oxide layer 115-3 may be $SiO_2$ or another suitable material such as SiN or SiON. The oxide layer 115-3 may have a thickness ranging from 10 nm to 100 nm in some embodiments. A low temperature plasma doping for the NFET side of the structure is performed after patterning the oxide layer 115-3 as shown. The low temperature plasma doping may be performed at temperatures between 25° C. and 400° C. in some embodiments.

Figure 12A:
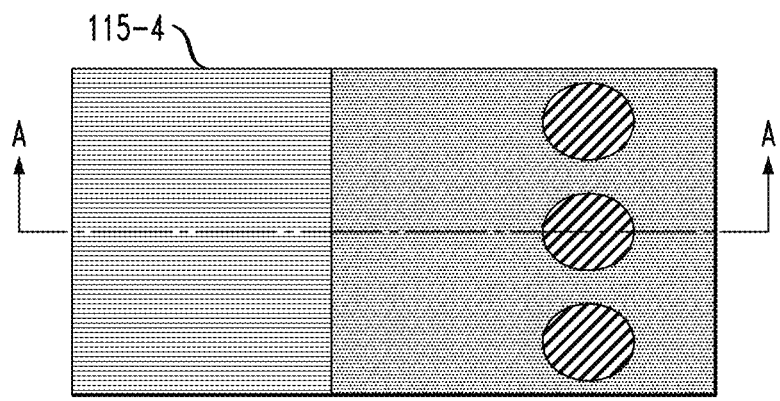
FIG. 12A depicts a top view of the FIG. 11A structure following doping of the PFET side, according to an embodiment of the invention.
Figure 12B:
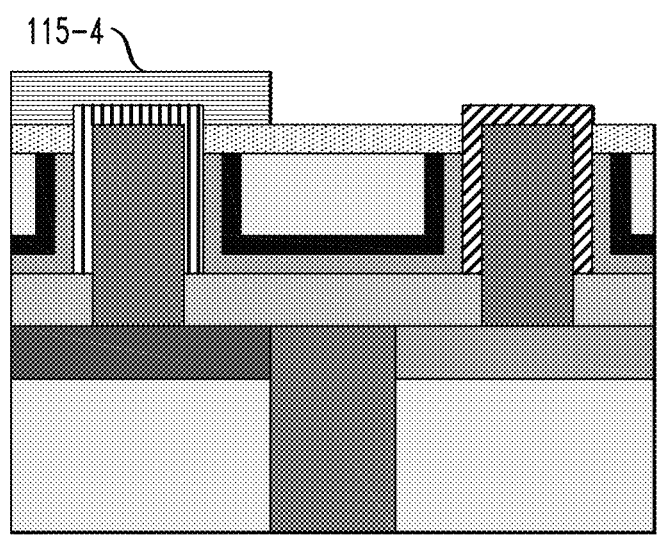
FIG. 12B depicts a side cross-sectional view of the FIG. 12A structure, according to an embodiment of the invention.

FIG. 12A shows a top view 1200 of the FIG. 11A structure following doping of the PFET side of the structure. FIG. 12B shows a side cross-sectional view 1250 taken along the line A-A in top view 1200 of FIG. 12A. The doping of the PFET side of the structure proceeds in a manner similar to that described above with respect to doping of the NFET side. Oxide layer 115-4, which may be similar in size and composition to that of oxide layer 115-3, is patterned to cover the NFET side of the structure while a low temperature plasma doping is performed on the exposed PFET side of the structure. The low temperature plasma doping may use boron, and take place at temperatures ranging from 25° C. to 400° C. in some embodiments.

Figure 13A:
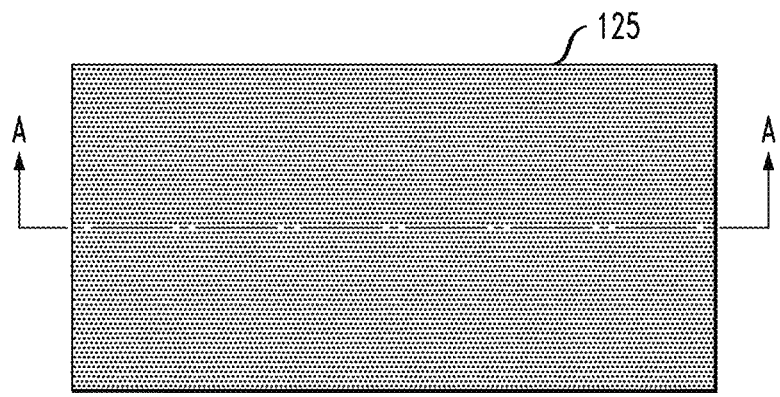
FIG. 13A depicts a top view of the FIG. 12A structure following deposition of a metal layer for source/drain material, according to an embodiment of the invention.
Figure 13B:
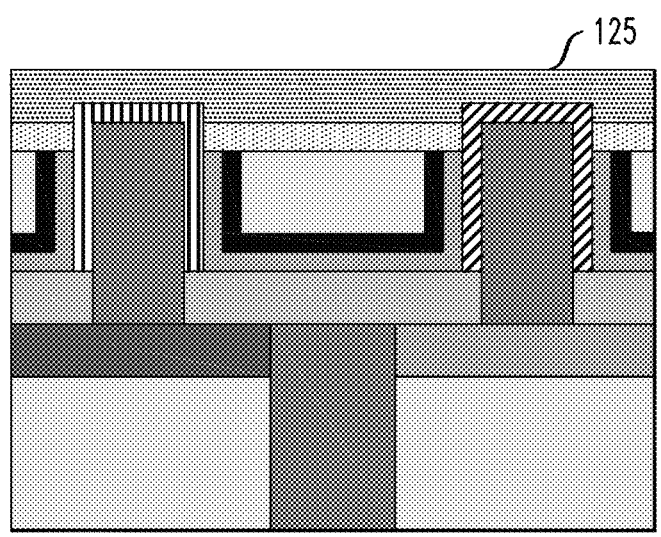
FIG. 13B depicts a side cross-sectional view of the FIG. 13A structure, according to an embodiment of the invention.

FIG. 13A shows a top view 1300 of the FIG. 12A structure following deposition of a metal layer 125 over the top of the structure. FIG. 13B shows a side cross-sectional view 1350 taken along the line A-A in top view 1300 of FIG. 13A. The metal layer 125 may be a nickel layer used for formation of metal source/drain regions as described below with respect to FIGS. 14A and 14B, although other materials such as titanium (Ti), tantalum (Ta) and platinum (Pt) may be used in some embodiments. The metal layer 125 may have a thickness ranging from 5nm to 20nm in some embodiments.

Figure 14A:
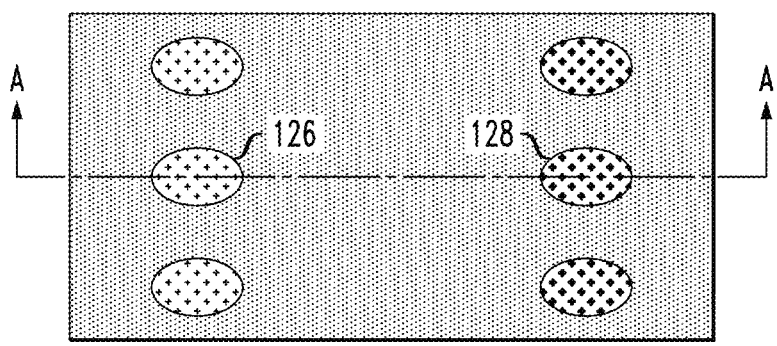
FIG. 14A depicts a top view of the FIG. 13A structure following formation of top source/drains, according to an embodiment of the invention.
Figure 14B:
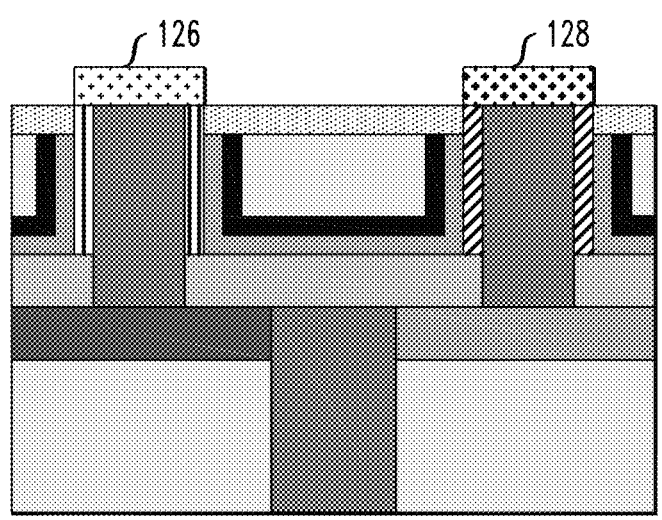
FIG. 14B depicts a side cross-sectional view of the FIG. 14A structure, according to an embodiment of the invention.

FIG. 14A shows a top view 1400 of the FIG. 13A structure following formation of top source/drain regions 126 and 128. FIG. 14B shows a side cross-sectional view 1450 taken along the line A-A in top view 1400 of FIG. 14A. To form the source/drain regions 126 and 128, a low temperature (e.g., <300° C.) silicidation or annealing process is performed, followed by removal of residue of the metal layer 125. A mixture of HF and hydrochloric (HCl) solution may be used to remove the residue of metal layer 125. In some embodiments, this results in formation of Ni—GaAs top source/drain regions 126 in the NFET side and formation of NiGe top source/drain regions 128 in the PFET side. The thickness of the top source/drain regions 126 and 128 may range from 5 nm to 20 nm in some embodiments.

Figure 15:
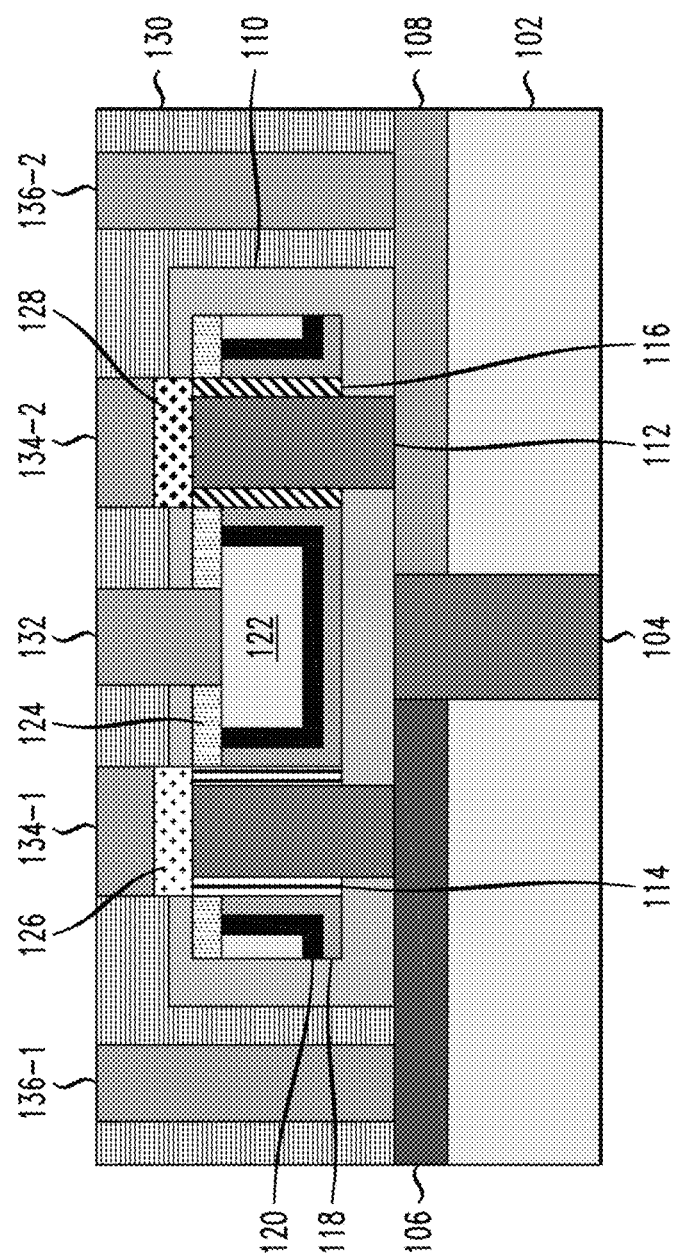
FIG. 15 depicts a side cross-sectional view of the FIG. 14B structure following formation of contacts, according to an embodiment of the invention.

FIG. 15 depicts a side cross-sectional view 1500 of the FIG. 14B structure following formation of contacts 132, 134-1, 134-2, 136-1 and 136-2. As shown an oxide layer 130 is formed over the FIG. 14B structure, and then patterned to allow formation of the gate contact 132, top source/drain contacts 134-1 and 134-2, and bottom source/drain contacts 136-1 and 136-2. The oxide layer 130 may be $SiO_2$ although other suitable materials may be used. The thickness of the oxide layer 130 may vary as needed for a particular device. In some embodiments, the thickness of oxide layer 130 ranges from 100 nm to 500 nm. The gate contact 132, top source/drain contacts 134-1 and 134-2 and bottom source/drain contacts 136-1 and 136-2 may be W, copper (Cu) or another suitable material. The gate contact 132, top source/drain contacts 134-1 and 134-2 and bottom source/drain contacts 136-1 and 136-2 may be formed by reactive-ion etching (RIE).

Although FIGS. 8-15 describe processing on the structure shown in FIGS. 6A and 6B, similar processing may be performed on the alternate channel structure shown in FIGS. 7A and 7B. Also, while various example materials, processes and dimensions are provided above, embodiments are not limited solely to use with the examples or ranges given unless specifically noted.

Figure 16:
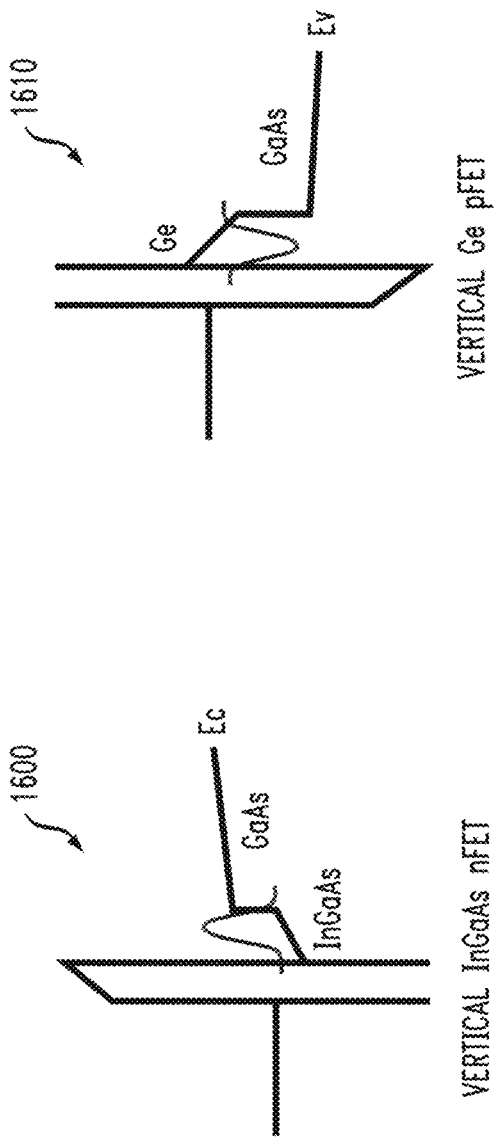
FIG. 16 depicts plots illustrating NFET and PFET excitation, according to an embodiment of the invention.

FIG. 16 shows plots 1600 and 1610 illustrating energy band diagrams. Due to band offsets of each channel material (e.g., InGaAs to the GaAs dummy channel and Ge to the GaAs dummy channel), inversion carriers could be confined in the InGaAs or Ge, not the GaAs dummy channel as illustrated.

In some embodiments, a semiconductor structure comprises a first nanowire of a first material formed on a substrate, at least a second nanowire of a second material different than the first material formed on the substrate, and a common gate stack surrounding the first nanowire and the second nanowire. The first nanowire and the second nanowire are vertical with respect to a horizontal plane of the substrate.

The semiconductor structure may be a vertical CMOS device, with the NFET channel provided by the first nanowire comprising a group III-V material such as InGaAs and the PFET channel provided by the second nanowire comprising a group II-IV material such as Ge. The NFET channel and PFET channel may be grown on dummy channels comprising GaAs. An insulator layer may be formed over the substrate and patterned, with the dummy channels being grown on the substrate in regions exposed by patterning the insulator layer.

The common gate stack is used for the NFET and PFET channels provided by the first and second nanowires, where the gate stack may comprise layers of $Al_2O_3$, $HfO_2$, and TiN. The CMOS device may have a gate material deposited over the common gate stack, where the gate material is a high-k metal such as W.

Layers formed over the dummy channels, such as an InGaAs layer over a dummy channel for the NFET and a Ge layer over a dummy channel for the PFET, may be doped, with a metal layer such as Ni formed over the top of such layers. Silicidation or annealing may be used to form top source/drain regions from the metal layer and the layers formed over the dummy channels.

In some embodiments, the first nanowire comprises a first dummy channel surrounded by the first material and the second nanowire comprises a second dummy channel surrounded by the second material, the first dummy channel and the second dummy channel comprising a third material different than the first material and the second material. The first material may comprise InGaAs, the second material may comprise Ge and the third material may comprise GaAs. In other embodiments, the first nanowire comprises a channel of the first material and the second nanowire comprises a dummy channel of the first material surrounded by the second material. The first material may comprise InGaAS and the second material may comprise Ge.

In some embodiments, the semiconductor structure described above may be part of a CMOS device of an integrated circuit.

The semiconductor structure described above may be formed in some embodiments using a method comprising forming a first nanowire of a first material on a substrate, forming a second nanowire of a second material different than the first material on the substrate, and forming a common gate stack surrounding the first nanowire and the second nanowire, wherein the first nanowire and the second nanowire are vertical with respect to a horizontal plane of the substrate.

In some embodiments, forming the first nanowire comprises forming a first dummy channel surrounded by the first material and forming the second nanowire comprises forming a second dummy channel surrounded by the second material, with the first dummy channel and the second dummy channel comprising a third material different than the first material and the second material. The first material may comprise InGaAs, the second material may comprise Ge and the third material may comprise GaAs. In other embodiments, forming the first nanowire comprises forming a channel of the first material and forming the second nanowire comprises forming a dummy channel of the first material surrounded by the second material. In such embodiments, the first material may comprise InGaAs and the second material may comprise Ge.

The method may further include forming a first bottom source/drain region in a top surface of a first portion of the substrate, forming a second bottom source/drain region in the top surface of the second portion of the substrate and forming a shallow trench isolation region between the first bottom source/drain and the second bottom source/drain. The method may also include forming a first insulator over at least a portion to the first bottom source/drain region, the shallow trench isolation region and the second bottom source/drain region and patterning the first insulator to form at least a first exposed region over the first bottom source/drain region and at least a second exposed region over the second bottom source/drain region.

In some embodiments, the method includes forming at least a first dummy channel over the first exposed region and at least a second dummy channel over the second exposed region. A first layer is formed on a top surface and sidewalls of the first dummy channel protruding above the first insulator and a second layer is formed on a top surface and sidewalls of the second dummy channel protruding above the first insulator. The first layer comprises the first material and the second layer comprises the second material. Forming the common gate stack includes forming the common gate stack over the first insulator, the first layer and the first second layer.

Gate material may be formed over the common gate stack. The gate material may be recessed to remove a portion of the common gate stack to expose a first portion of the first layer and a second portion of the second layer. A second insulator may then be formed over the gate material. The exposed first portion of the first layer may be doped with a first dopant type while the exposed second portion of the second layer is doped with a second dopant type different than the first dopant type.

The method may further include forming a metal layer over the second insulator, the exposed first portion of the first layer and the exposed second portion of the second layer, and annealing the structure to form a first top source/drain from the metal layer and the exposed first portion of the first layer on the first dummy channel and a second top source/drain from the metal layer and the exposed second portion of the second layer on the second dummy channel. An oxide may then be formed on the top surface of the first bottom source/drain region and the second bottom source/drain region such that the oxide surrounds the common gate stack, the gate material, the first top source/drain region and the second top source/drain region. The oxide may then be patterned to expose portions of the first bottom source/drain region, the second bottom source/drain region, the first top source/drain region, the second top source/drain region and the gate material. Contacts may then be formed in the exposed portions of the oxide to contact the first bottom source/drain region, the second bottom source/drain region, the first top source/drain region, the second top source/drain region and the gate material.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a first nanowire of a first material disposed on a top surface of a substrate;
   at least a second nanowire of a second material different than the first material disposed on the top surface of the substrate; and
   a common gate stack surrounding the first nanowire and the second nanowire;
   wherein the first nanowire and the second nanowire are vertical with respect to a horizontal plane of the top surface of the substrate;
   wherein the first nanowire forms at least a portion of a negative field-effect transistor (NFET) vertical transport channel of a complementary metal-oxide-semiconductor (CMOS) device;
   wherein the second nanowire forms at least a portion of a positive field-effect transistor (PFET) vertical transport channel of the CMOS device; and
   wherein the first material comprises a group III-V material and the second material comprises a group IV material.

2. The semiconductor structure of claim 1, wherein the first material comprises indium gallium arsenide (InGaAs) and the second material comprises germanium (Ge).

3. The semiconductor structure of claim 1, wherein the first nanowire comprises a first dummy channel surrounded by the first material and the second nanowire comprises a second dummy channel surrounded by the second material, the first dummy channel and the second dummy channel comprising a third material different than the first material and the second material.

4. The semiconductor structure of claim 3, wherein the first material comprises indium gallium arsenide (InGaAs), the second material comprises germanium (Ge) and the third material comprises gallium arsenide (GaAs).

5. The semiconductor structure of claim 1, wherein the first nanowire comprises a channel of the first material and the second nanowire comprises a dummy channel of the first material surrounded by the second material.

6. The semiconductor structure of claim 5, wherein the first material comprise indium gallium arsenide (InGaAS) and the second material comprises germanium (Ge).

7. An integrated circuit comprising:
   at least one complementary metal-oxide-semiconductor (CMOS) device, the CMOS device comprising:
      a first nanowire of a first material disposed on a top surface of a substrate;
      at least a second nanowire of a second material different than the first material disposed on the top surface of the substrate; and
      a common gate stack surrounding the first nanowire and the second nanowire;
   wherein the first nanowire and the second nanowire are vertical with respect to a horizontal plane of the top surface of the substrate;
   wherein the first nanowire forms at least a portion of a negative field-effect transistor (NFET) vertical transport channel of the CMOS device;
   wherein the second nanowire forms at least a portion of a positive field-effect transistor (PFET) vertical transport channel of the CMOS device; and
   wherein the first material comprises a group III-V material and the second material comprises a group IV material.

8. The integrated circuit of claim 7, wherein the first material comprises indium gallium arsenide (InGaAs) and the second material comprises germanium (Ge).

9. A method for forming a semiconductor structure, comprising:
   forming a first nanowire of a first material on a top surface of a substrate;
   forming a second nanowire of a second material different than the first material on the top surface of the substrate; and forming a common gate stack surrounding the first nanowire and the second nanowire;

wherein the first nanowire and the second nanowire are vertical with respect to a horizontal plane of the top surface of the substrate;

wherein the first nanowire forms at least a portion of a negative field-effect transistor (NFET) vertical transport channel of the CMOS device;

wherein the second nanowire forms at least a portion of a positive field-effect transistor (PFET) vertical transport channel of the CMOS device; and wherein the first material comprises a group III-V material and the second material comprises a group IV material.

10. The method of claim 9, wherein:

forming the first nanowire comprises forming a first dummy channel surrounded by the first material;

forming the second nanowire comprises forming a second dummy channel surrounded by the second material; and the first dummy channel and the second dummy channel comprise a third material different than the first material and the second material.

11. The method of claim 10, wherein the first material comprises indium gallium arsenide (InGaAs), the second material comprises germanium (Ge) and the third material comprises gallium arsenide (GaAs).

12. The method of claim 9, wherein:

forming the first nanowire comprises forming a channel of the first material;

forming the second nanowire comprises forming a dummy channel of the first material surrounded by the second material.

13. The method of claim 12, wherein the first material comprises indium gallium arsenide (InGaAS) and the second material comprises germanium (Ge).

14. The method of claim 9, further comprising:

forming a first bottom source/drain region in a first portion of the top surface of the substrate;

forming a second bottom source/drain region in a second portion of the top surface of the substrate; and forming a shallow trench isolation region between the first bottom source/drain and the second bottom source/drain.

15. The method of claim 14, further comprising:

forming a first insulator over at least a portion of the first bottom source/drain region, the shallow trench isolation region and the second bottom source/drain region; and patterning the first insulator to form at least a first exposed region over the first bottom source/drain region and at least a second exposed region over the second bottom source/drain region.

16. The method of claim 15, further comprising:

forming at least a first dummy channel over the first exposed region and at least a second dummy channel over the second exposed region;

forming a first layer on a top surface and sidewalls of the first dummy channel protruding above the first insulator and a second layer on a top surface and sidewalls of the second dummy channel protruding above the first insulator, the first layer comprising the first material and the second layer comprising the second material; and forming the common gate stack over the first insulator, the first layer and the first second layer.

17. The method of claim 16, further comprising:

forming gate material over the common gate stack and recessing the gate material to remove a portion of the common gate stack to expose a first portion of the first layer and a second portion of the second layer;

forming a second insulator over the gate material;

doping the exposed first portion of the first layer with a first dopant type;

doping the exposed second portion of the second layer with a second dopant type different than the first dopant type.

18. The method of claim 17, further comprising:

forming a metal layer over the second insulator, the exposed first portion of the first layer and the exposed second portion of the second layer; and annealing the structure to form a first top source/drain from the metal layer and the exposed first portion of the first layer on the first dummy channel and a second top source/drain from the metal layer and the exposed second portion of the second layer on the second dummy channel.

19. The method of claim 18, further comprising:

forming an oxide on the top surface of the first bottom source/drain region and the second bottom source/drain region, the oxide surrounding the common gate stack, the gate material, the first top source/drain region and the second top source/drain region;

patterning the oxide to expose portions of the first bottom source/drain region, the second bottom source/drain region, the first top source/drain region, the second top source/drain region and the gate material; and forming contacts to the first bottom source/drain region, the second bottom source/drain region, the first top source/drain region, the second top source/drain region and the gate material in the portions exposed by the patterned oxide.

* * * * *